(12) United States Patent
Kawaguchi et al.

(10) Patent No.: US 12,363,968 B2
(45) Date of Patent: Jul. 15, 2025

(54) SEMICONDUCTOR DEVICE, RESERVOIR COMPUTING SYSTEM, AND METHOD FOR MANUFACTURING SEMICONDUCTOR DEVICE

(71) Applicant: FUJITSU LIMITED, Kawasaki (JP)

(72) Inventors: Kenichi Kawaguchi, Ebina (JP); Tsuyoshi Takahashi, Ebina (JP)

(73) Assignee: Fujitsu Limited, Kawasaki (JP)

( * ) Notice: Subject to any disclaimer, the term of this patent is extended or adjusted under 35 U.S.C. 154(b) by 498 days.

(21) Appl. No.: 17/954,385

(22) Filed: Sep. 28, 2022

(65) Prior Publication Data

US 2023/0015231 A1    Jan. 19, 2023

Related U.S. Application Data

(63) Continuation of application No. PCT/JP2020/016567, filed on Apr. 15, 2020.

(51) Int. Cl.
*H10D 8/75* (2025.01)
*H01L 21/02* (2006.01)
(Continued)

(52) U.S. Cl.
CPC ..... *H10D 62/122* (2025.01); *H01L 21/02546* (2013.01); *H01L 21/02549* (2013.01);
(Continued)

(58) Field of Classification Search
CPC .... H10D 8/053; H10D 8/70–755; H10D 8/75; H10D 8/411; H10D 8/422;
(Continued)

(56) References Cited

U.S. PATENT DOCUMENTS 5,811,832 A * 9/1998 Alphenaar ............ H10B 99/16
257/17
2011/0253981 A1   10/2011 Rooyackers et al.
(Continued)

FOREIGN PATENT DOCUMENTS

JP    H8-213561 A    8/1996
JP    2008-511985 A    4/2008
(Continued)

OTHER PUBLICATIONS

Japanese Office Action mailed Jun. 13, 2023 for corresponding Japanese Patent Application No. 2022-514920, with English Translation, 12 pages.
(Continued)

*Primary Examiner* — Matthew C Landau
*Assistant Examiner* — Nora T. Nix
(74) *Attorney, Agent, or Firm* — Fujitsu Intellectual Property Center

(57) ABSTRACT

A semiconductor device includes a plurality of tunnel diodes, each of which includes a first semiconductor region of a first conductive type and a second semiconductor region of a second conductive type that is provided above the first semiconductor region, the second semiconductor region being a nanowire shape; an insulating film provided around a side surface of the second semiconductor region; a plurality of first electrodes, each coupled to the first semiconductor region; and a plurality of second electrodes, each coupled to the second semiconductor region, wherein the second electrode has a first surface that faces the side surface of the second semiconductor region across the insulating film, and a diameter of a second semiconductor region of a first tunnel diode of the plurality of tunnel diodes is different from a diameter of a second semiconductor region of a second tunnel diode.

11 Claims, 20 Drawing Sheets

(51) Int. Cl.
*H10D 8/01* (2025.01)
*H10D 62/10* (2025.01)
*H10D 62/824* (2025.01)
*H10D 84/00* (2025.01)
*H10D 84/05* (2025.01)

(52) U.S. Cl.
CPC .... *H01L 21/02603* (2013.01); *H01L 21/0262* (2013.01); *H01L 21/02642* (2013.01); *H10D 8/053* (2025.01); *H10D 8/75* (2025.01); *H10D 62/824* (2025.01); *H10D 84/05* (2025.01); *H10D 84/221* (2025.01)

(58) Field of Classification Search
CPC .. G06N 3/044; G06N 3/063; G06N 3/00–126; H01L 21/02603
See application file for complete search history.

(56) References Cited

U.S. PATENT DOCUMENTS

| | | | |
|---|---|---|---|
| 2012/0187376 A1* | 7/2012 | Tomioka | C30B 25/186 977/762 |
| 2014/0175372 A1 | 6/2014 | Aberg et al. | |
| 2015/0005610 A1* | 1/2015 | Zhang | A61B 5/6877 600/386 |

FOREIGN PATENT DOCUMENTS

| | | |
|---|---|---|
| JP | 2011-238909 A | 11/2011 |
| JP | 2013-508966 A | 3/2013 |
| JP | 2015-529006 A | 10/2015 |
| JP | 2016-510943 A | 4/2016 |
| WO | 2006/025793 A1 | 3/2006 |
| WO | 2010/062644 A2 | 6/2010 |
| WO | 2011/049529 A1 | 4/2011 |
| WO | 2014/006503 A2 | 1/2014 |
| WO | 2014/096962 A2 | 6/2014 |

OTHER PUBLICATIONS

Hu, Xiaofang et al., "Multilayer RTD-memristor-based cellular neural networks for color image processing", Neurocomputing, vol. 162, Apr. 4, 2015, pp. 150-162, XP029233630.

EESR—The Extended European Search Report of European Patent Application No. 20931249.5 dated May 8, 2023.

Tsuyoshi Takahashi et al., "Realization of Large Breakdown Voltage of GaAsSb-Based Backward Diodes Using Carrier Depletion Effect Originating from Nanowires", Extended Abstracts of the 2019 International Conference on Solid State Devices and Materials, Nagoya, pp. 195-196, D-5-04, 2019 (Total 2 pages).

Bahram Ganjipour et al., "High Current Density Esaki Tunnel Diodes Based on GaSb-InAsSb Heterostructure Nanowires", ACS Publications, 2011 American Chemical Society, Nano Letters, vol. 11, pp. 4222-4226, dx.doi. org/10.1021/nl202180b, Sep. 6, 2011 (Total 5 pages) (Cited in ISR).

Xiaofang Hu et al., "Multilayer RTD-memristor-based Cellular Neural Networks for Color Image Processing", Elsevier, Neurocomputing, vol. 162, pp. 150-162, dx.doi.org/10.1016/j.neucom.2015.03. 057, Apr. 4, 2015 (Total 13 pages) (Cited in ISR).

International Search Report and Written Opinion of the International Searching Authority (Form PCT/ISA/210, 220, and 237), mailed in connection with PCT/JP2020/016567 and mailed Jul. 7, 2020 (Total 19 pages).

* cited by examiner

SEMICONDUCTOR DEVICE, RESERVOIR COMPUTING SYSTEM, AND METHOD FOR MANUFACTURING SEMICONDUCTOR DEVICE

CROSS-REFERENCE TO RELATED APPLICATION

This application is a continuation application of International Application PCT/JP2020/016567 filed on Apr. 15, 2020 and designated the U.S., the entire contents of which are incorporated herein by reference.

FIELD

The present disclosure relates to a semiconductor device, a reservoir computing system, and a method for manufacturing a semiconductor device.

BACKGROUND

In order to provide advanced information processing services using artificial intelligence, development of computing systems for the AI has been advanced. There is a growing movement to implement such systems by adopting neuromorphic computing inspired by a neural model of a living body. In the movement, reservoir computing is expected as a technology to advance AI, such as recognition and prediction of a moving image, because the reservoir computing is capable of time-series information processing. In a reservoir computing system, a network type circuit called a reservoir circuit, which includes a plurality of nonlinear elements having different nonlinear characteristics, is used.

Patent Document 1: Japanese Laid-open Patent Publication No. 8-213561, Patent Document 2: Japanese Laid-open Patent Publication No. 2011-238909, Patent Document 3: Japanese National Publication of International Patent Application No. 2015-529006, and Non-Patent Document 1: Tsuyoshi Takahashi, Kenichi Kawaguchi, Masaru Sato, Michihiko Suhara, and Naoya Okamoto, "Realization of Large Breakdown Voltage of GaAsSb-Based Backward Diodes using Carrier Depletion Effect Originating from Nanowires", Extended Abstracts of the 2019 International Conference on Solid State Devices and Materials, Nagoya, 2019, pp 195-196.

SUMMARY

According to an aspect of the embodiments, a semiconductor device includes a plurality of tunnel diodes, each of which includes a first semiconductor region of a first conductive type and a second semiconductor region of a second conductive type that is provided above the first semiconductor region, the second semiconductor region being a nanowire shape; an insulating film provided around a side surface of the second semiconductor region; a plurality of first electrodes, each coupled to the first semiconductor region; and a plurality of second electrodes, each coupled to the second semiconductor region, wherein the second electrode has a first surface that faces the side surface of the second semiconductor region across the insulating film, and a diameter on an upper surface of a second semiconductor region of a first tunnel diode of the plurality of tunnel diodes is different from a diameter on an upper surface of a second semiconductor region of a second tunnel diode of the plurality of tunnel diodes.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

It is difficult to arrange a plurality of nonlinear elements having different nonlinear characteristics with a high degree of integration.

An object of the present disclosure is to provide a semiconductor device, a reservoir computing system, and a method for manufacturing a semiconductor device that are capable of arranging a plurality of nonlinear elements having different nonlinear characteristics with a high degree of integration.

According to one form of the present disclosure, there is provided a semiconductor device including: a plurality of tunnel diodes, each of which includes a first semiconductor region of a first conductive type and a second semiconductor region of a second conductive type that is provided above the first semiconductor region and has a nanowire shape; an insulating film that covers a side surface of the second semiconductor region; a plurality of first electrodes, each connected to the first semiconductor region; and a plurality of second electrodes, each connected to the second semiconductor region, in which the second electrode has a first surface that faces the side surface of the second semiconductor region with the insulating film interposed therebetween, and diameters of the second semiconductor regions are different among the plurality of tunnel diodes.

According to the present disclosure, a plurality of nonlinear elements having different nonlinear characteristics may be arranged with a high degree of integration.

Hereinafter, embodiments of the present disclosure will be specifically described with reference to the accompanying drawings. Note that, in the present specification and drawings, components having substantially the same functional configuration are denoted by the same reference signs, and redundant description may be omitted.

First Embodiment

Figure 1:
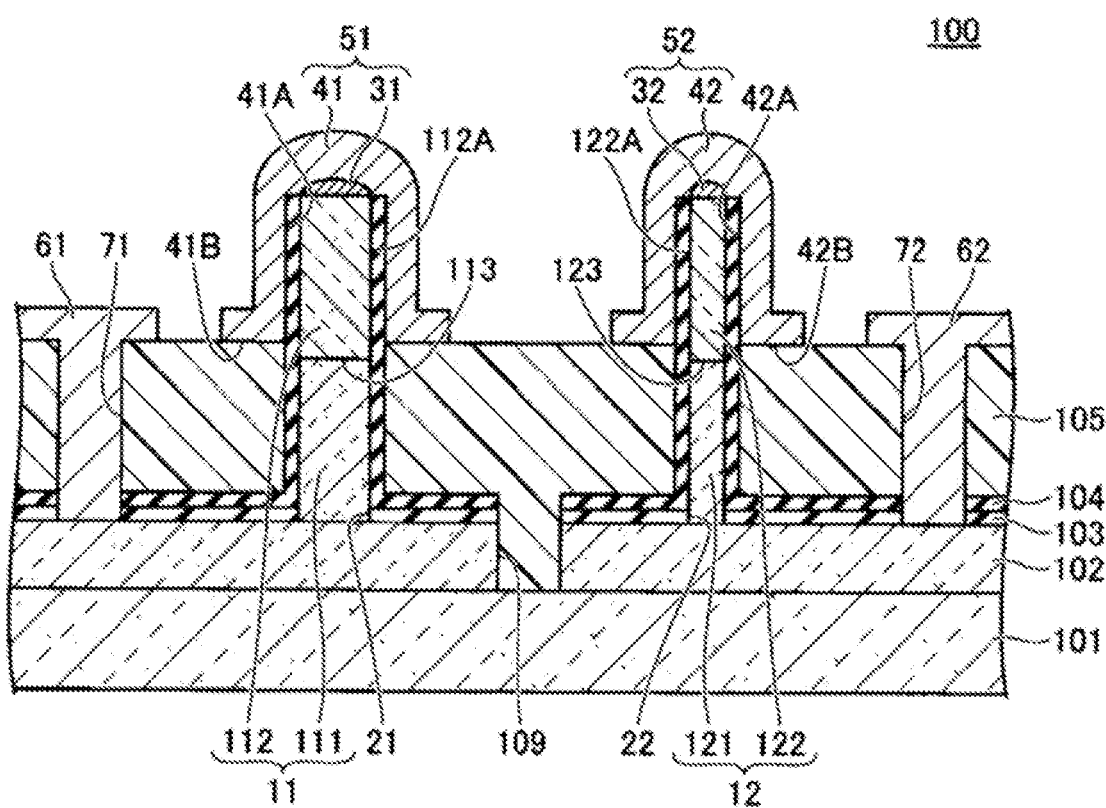
FIG. 1 is a cross-sectional view illustrating a semiconductor device according to a first embodiment.

A first embodiment will be described. The first embodiment relates to a semiconductor device including a semiconductor region having a nanowire shape. FIG. 1 is a cross-sectional view illustrating the semiconductor device according to the first embodiment.

As illustrated in FIG. 1, in a semiconductor device 100 according to the first embodiment, an n-type semiconductor layer 102 is formed on a substrate 101, and an insulating film 103 is formed on the n-type semiconductor layer 102. In the insulating film 103, openings 21 and 22 reaching the n-type semiconductor layer 102 are formed. For example, the substrate 101 is a semi-insulating (SI)-GaAs(111)B substrate, and the n-type semiconductor layer 102 is an n-type GaAs layer having a thickness of 100 nm to 300 nm. For example, the insulating film 103 is a silicon nitride film having a thickness of 40 nm to 60 nm, and diameters of the openings 21 and 22 are 40 nm to 200 nm. The diameter of the opening 21 is larger than the diameter of the opening 22.

The semiconductor device 100 includes a first nanowire 11 grown above the substrate 101 through the opening 21 and a second nanowire 12 grown above the substrate 101 through the opening 22. For example, diameters of the first nanowire 11 and the second nanowire 12 are 40 nm to 200 nm. The first nanowire 11 is thicker than the second nanowire 12. The n-type semiconductor layer 102 is separated into a region connected to the first nanowire 11 and a region connected to the second nanowire 12 by an element separation groove 109.

The first nanowire 11 has an n-type first semiconductor region 111 and a p-type second semiconductor region 112. The first semiconductor region 111 is provided on the n-type semiconductor layer 102 and extends upward. The second semiconductor region 112 is provided on the first semiconductor region 111 and extends upward. A metal film 31 is formed on the second semiconductor region 112. The metal film 31 is, for example, a gold (Au) film having a diameter of 40 nm to 200 nm.

The second nanowire 12 has an n-type first semiconductor region 121 and a p-type second semiconductor region 122. The first semiconductor region 121 is provided on the n-type semiconductor layer 102 and extends upward. The second semiconductor region 122 is provided on the first semiconductor region 121 and extends upward. A metal film 32 is formed on the second semiconductor region 122. The metal film 32 is, for example, a gold (Au) film having a diameter of 40 nm to 200 nm.

The second semiconductor regions 112 and 122 have a nanowire shape. The first semiconductor regions 111 and 121 may also have the nanowire shape. For example, the first semiconductor regions 111 and 121 are n-type InAs nanowires, and the second semiconductor regions 112 and 122 are p-type $GaAs_{1-x}Sb_x$ nanowires. An Sb composition ratio x of $GaAs_{1-x}Sb_x$ is preferably 0.8 or more, and the Sb composition ratio x may be 1.0. The n-type first semiconductor region 111 and the p-type second semiconductor region 112 are in tunnel junction with each other, and the n-type first semiconductor region 121 and the p-type second semiconductor region 122 are in tunnel junction with each other. The first nanowire 11 and the second nanowire 12 are examples of tunnel diodes.

Heights (lengths) of the first semiconductor regions 111 and 121 are, for example, 0.5 μm to 0.7 μm, and the height of the first semiconductor region 111 and the height of the first semiconductor region 121 may be equal to each other. Heights (lengths) of the second semiconductor regions 112 and 122 are, for example, 1.0 μm to 1.5 μm, and the height of the second semiconductor region 112 and the height of the second semiconductor region 122 may be equal to each other. Heights (lengths) of the first nanowire 11 and the second nanowire 12 are, for example, 1.5 μm to 2.0 μm, and the height of the first nanowire 11 and the height of the second nanowire 12 may be equal to each other.

An insulating film 104 is formed to cover a side surface of the first nanowire 11 and a side surface of the second nanowire 12. The insulating film 104 is, for example, an aluminum oxide film or a hafnium oxide film having a thickness of 10 nm to 30 nm. The thickness referred to here is a thickness in a direction perpendicular to side surfaces 112A and 122A of the second semiconductor regions 112 and 122. The insulating film 104 is also formed on the insulating film 103.

An organic insulating film 105 is formed on the insulating film 104. The organic insulating film 105 is, for example, a benzocyclobutene (BCB) film. An upper surface of the organic insulating film 105 is above a junction interface 113 between the first semiconductor region 111 and the second semiconductor region 112 and a junction interface 123 between the first semiconductor region 121 and the second semiconductor region 122.

On the organic insulating film 105, a metal film 41 in contact with the metal film 31 and a metal film 42 in contact with the metal film 32 are formed. The metal films 41 and 42 are, for example, laminated films of a platinum (Pt) film and a gold (Au) film thereon. The metal film 41 has a surface 41A facing the side surface 112A of the second semiconductor region 112 with the insulating film 104 interposed therebetween. The metal film 42 has a surface 42A facing the side surface 122A of the second semiconductor region 122 with the insulating film 104 interposed therebetween. For example, a lower surface 41B of the metal film 41 and a lower surface 42B of the metal film 42 are above the junction interface 113 between the first semiconductor region 111 and the second semiconductor region 112 and the junction interface 123 between the first semiconductor region 121 and the second semiconductor region 122. The metal films 31 and 41 are included in an anode electrode 51, and the anode electrode 51 is in ohmic contact with the second semiconductor region 112. The metal films 32 and 42 are included in an anode electrode 52, and the anode electrode 52 is in ohmic contact with the second semiconductor region 122. The anode electrodes 51 and 52 are examples of second electrodes. The surfaces 41A and 42A are examples of first surfaces.

In the organic insulating film 105, the insulating film 104, and the insulating film 103, an opening 71 reaching a region connected to the first semiconductor region 111 of the n-type semiconductor layer 102 and an opening 72 reaching a region connected to the first semiconductor region 121 of the n-type semiconductor layer 102 are formed. On the organic insulating film 105, a cathode electrode 61 in contact with the n-type semiconductor layer 102 through the opening 71 and a cathode electrode 62 in contact with the n-type semiconductor layer 102 through the opening 72 are formed. The metal films 41 and 42 are, for example, laminated films of a gold germanium (AuGe) film and a gold (Au) film thereon. The cathode electrodes 61 and 62 are examples of first electrodes.

Figure 2:
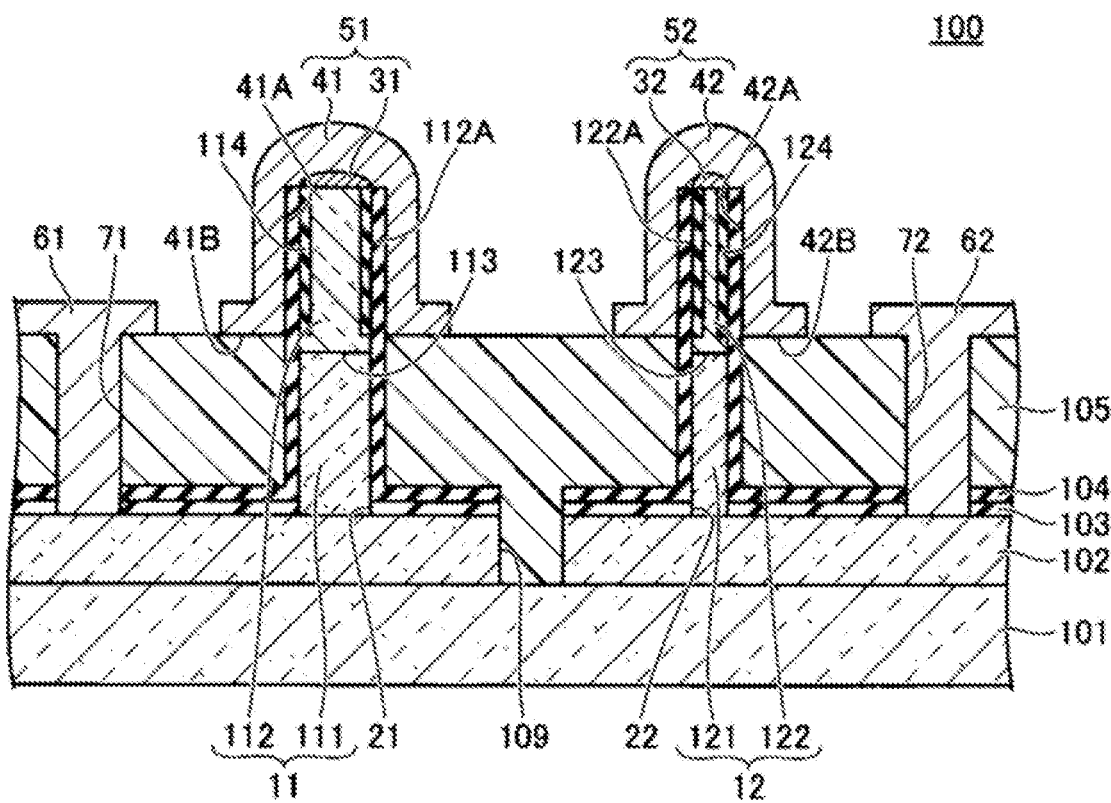
FIG. 2 is a cross-sectional view illustrating the semiconductor device according to the first embodiment during operation.
Figure 3:
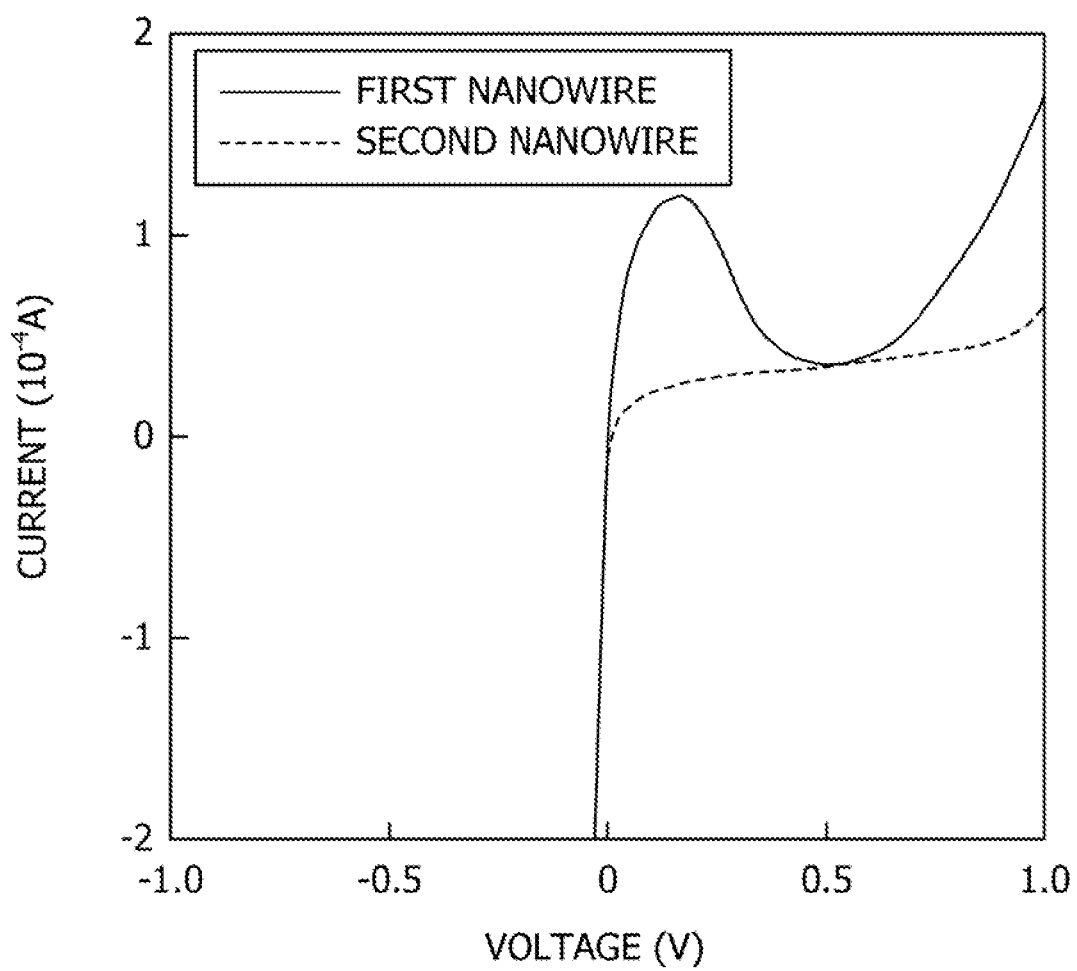
FIG. 3 is a diagram illustrating voltage-current characteristics of nanowires.

Here, an action of the semiconductor device 100 will be described. FIG. 2 is a cross-sectional view illustrating the semiconductor device 100 according to the first embodiment during operation. FIG. 3 is a diagram illustrating voltage-current characteristics of the first nanowire 11 and the second nanowire 12.

When a forward voltage is applied between the anode electrode 51 and the cathode electrode 61, as illustrated in FIG. 2, a depletion layer 114 is formed in the vicinity of the side surface 112A of the second semiconductor region 112 due to an influence of an electric field from the metal film 41. Similarly, when a forward voltage is applied between the anode electrode 52 and the cathode electrode 62, as illustrated in FIG. 2, a depletion layer 124 is formed in the vicinity of the side surface 122A of the second semiconductor region 122 due to an influence of an electric field from the metal film 42. When the forward voltages have almost the same magnitude, thicknesses of the depletion layers 114 and 124 are almost the same. In the semiconductor device 100, a diameter of the second semiconductor region 112 is larger a diameter of the second semiconductor region 122. Thus, when the thicknesses of the depletion layers 114 and 124 are almost the same, a ratio of the depletion layer 114 occupying the second semiconductor region 112 in a radial direction is smaller than a ratio of the depletion layer 124 occupying the second semiconductor region 122 in the radial direction. Therefore, as illustrated in FIG. 3, the voltage-current characteristic of the first nanowire 11 and the voltage-current characteristic of the second nanowire 12 are different. That is, nonlinear characteristics are different between the first nanowire 11 and the second nanowire 12. For example, the first nanowire 11 functions as an Esaki diode and exhibits an S-shaped characteristic including a negative resistance component, while the second nanowire 12 exhibits a simple rectifying characteristic.

The thickness of the insulating film 104 is preferably 10 nm or more and 30 nm or less, and more preferably 10 nm or more and 20 nm or less. In a case where the insulating film 104 is too thin, it may not be possible to sufficiently secure an insulating property between the second semiconductor region 112 and the metal film 41 and an insulating property between the second semiconductor region 122 and the metal film 42. In a case where the insulating film 104 is too thick, the depletion layers 114 and 124 may not be sufficiently formed.

Next, a method for manufacturing the semiconductor device 100 will be described. FIGS. 4 to 12 are cross-sectional views illustrating the method for manufacturing the semiconductor device 100 according to the first embodiment.

Figure 4:
FIG. 4 is a cross-sectional view (part 1) illustrating a method for manufacturing the semiconductor device according to the first embodiment.

First, as illustrated in FIG. 4, the n-type semiconductor layer 102 is formed on the substrate 101. The n-type semiconductor layer 102 may be grown by, for example, a metal organic chemical vapor deposition (MOCVD) method. Next, the insulating film 103 is formed on the n-type semiconductor layer 102.

Figure 5:
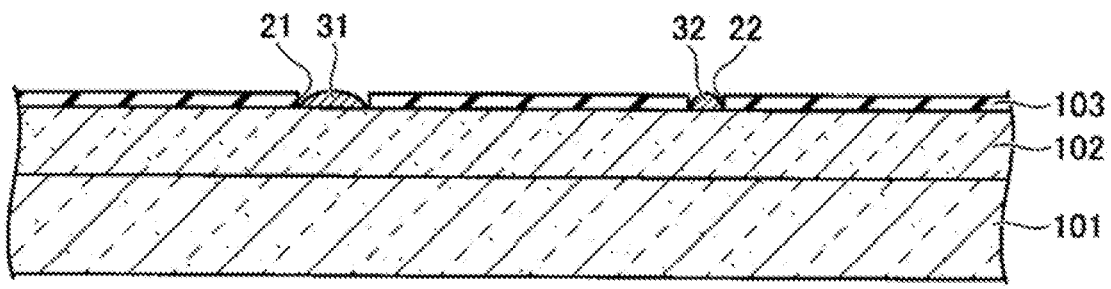
FIG. 5 is a cross-sectional view (part 2) illustrating the method for manufacturing the semiconductor device according to the first embodiment.

Thereafter, as illustrated in FIG. 5, the openings 21 and 22 are formed in the insulating film 103. The openings 21 and 22 may be formed by, for example, forming a mask by lithography and etching the insulating film 103 by using the mask. The diameters of the openings 21 and 22 are assumed to be 40 nm to 200 nm, and the diameter of the opening 21 is made larger than the diameter of the opening 22. Subsequently, as catalysts for nanowires, for example, the disk-shaped metal film 31 is formed in the opening 21, and for example, the disk-shaped metal film 32 is formed in the opening 22. As a material of the metal films 31 and 32, for example, gold (Au) is used. In this way, a substrate for crystal growth including the substrate 101, the n-type semiconductor layer 102, the insulating film 103, the metal film 31, and the metal film 32 is obtained. The insulating film 103 in which the openings 21 and 22 are formed is an example of a growth mask.

Figure 6:
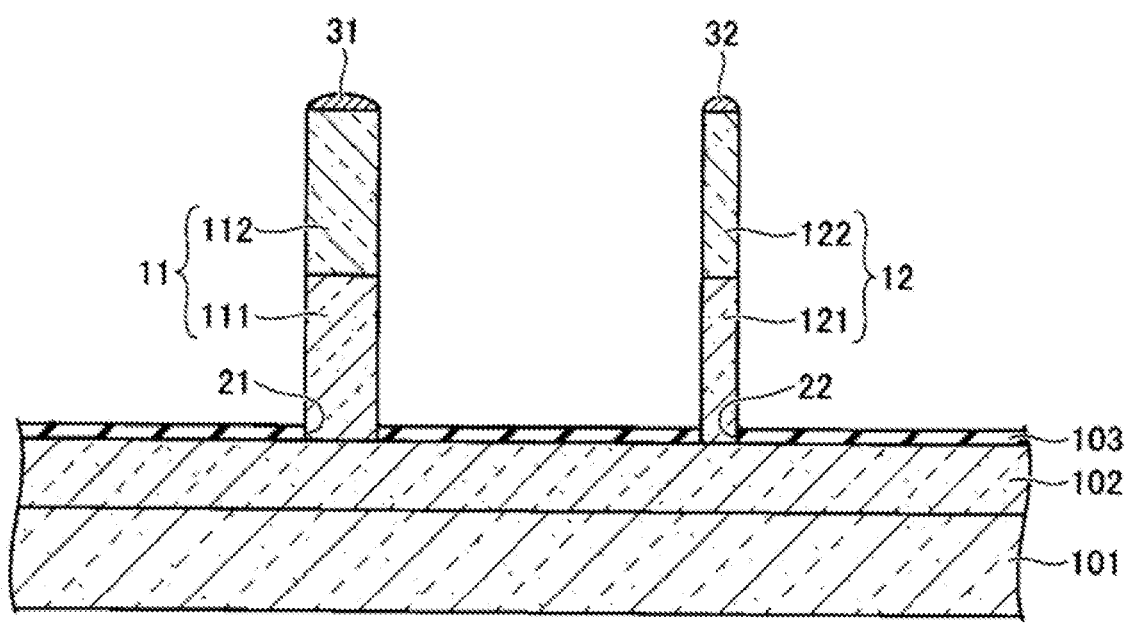
FIG. 6 is a cross-sectional view (part 3) illustrating the method for manufacturing the semiconductor device according to the first embodiment.

Next, as illustrated in FIG. 6, the first semiconductor regions 111 and 121, which include n-type GaAs and have a nanowire shape, are grown above the substrate 101. The first semiconductor region 111 is grown from the inside of the opening 21, and the first semiconductor region 121 is grown from the inside of the opening 22. The first semiconductor regions 111 and 121 may be grown by, for example, the MOCVD method. For example, it is assumed that a growth temperature is 400° C. to 450° C. and the heights (lengths) of the first semiconductor regions 111 and 121 are 0.5 μm to 0.7 μm. For example, triethylgallium (TEGa) is used as a raw material of Ga, and arsine (AsH$_3$) is used as a raw material of As. Furthermore, hydrogen sulfide (H$_2$S) is used as a raw material of an n-type impurity, and sulfur (S) is doped as the n-type impurity. It is assumed that a S concentration is, for example, $1 \times 10^{18}$ cm$^{-3}$ to $1 \times 10^{20}$ cm$^{-3}$. Compositions of the first semiconductor regions 111 and 121 are equal to each other, and concentrations of the n-type impurities included in the first semiconductor regions 111 and 121 are also equal to each other.

Moreover, as also illustrated in FIG. 6, the second semiconductor regions 112 and 122, which include p-type GaAsSb and have a nanowire shape, are grown above the substrate 101. The second semiconductor region 112 is grown on the first semiconductor region 111, and the second semiconductor region 122 is grown on the first semiconductor region 121. The second semiconductor regions 112 and 122 may be grown by the MOCVD method in the same manner as the first semiconductor regions 111 and 121. For example, it is assumed that a growth temperature is 400° C. to 450° C. and the heights (lengths) of the second semiconductor regions 112 and 122 are 1.0 μm to 1.5 μm. For example, triethylgallium (TEGa) is used as a raw material of Ga, arsine (AsH$_3$) is used as a raw material of As, and trimethylantimony (TMSb) is used as a raw material of Sb.

Furthermore, diethylzinc (DEZn) is used as a raw material of a p-type impurity, and Zn is doped as the p-type impurity. It is assumed that a Zn concentration is, for example, $1\times10^{18}$ cm$^{-3}$ to $1\times10^{20}$ cm$^{-3}$. Compositions of the second semiconductor regions 112 and 122 are equal to each other, and concentrations of the p-type impurities included in the second semiconductor regions 112 and 122 are also equal to each other.

As a result, the first nanowire 11 including the first semiconductor region 111 and the second semiconductor region 112 and the second nanowire 12 including the first semiconductor region 121 and the second semiconductor region 122 are obtained. The diameter of the first nanowire 11 is larger than the diameter of the second nanowire 12.

Figure 7:
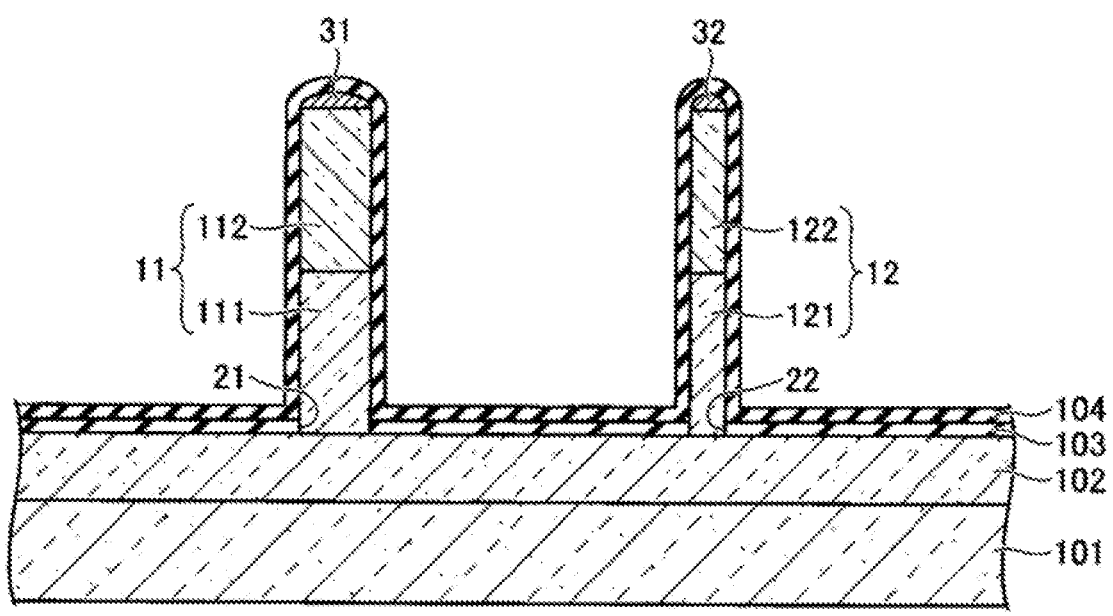
FIG. 7 is a cross-sectional view (part 4) illustrating the method for manufacturing the semiconductor device according to the first embodiment.

Next, as illustrated in FIG. 7, the insulating film 104 covering the first nanowire 11, the second nanowire 12, and the insulating film 103 is formed. As the insulating film 104, for example, an aluminum oxide film or a hafnium oxide film having a thickness of 10 nm to 30 nm, preferably 10 nm to 20 nm is formed. The insulating film 104 may be formed by, for example, an atomic layer deposition (ALD) method.

Figure 8:
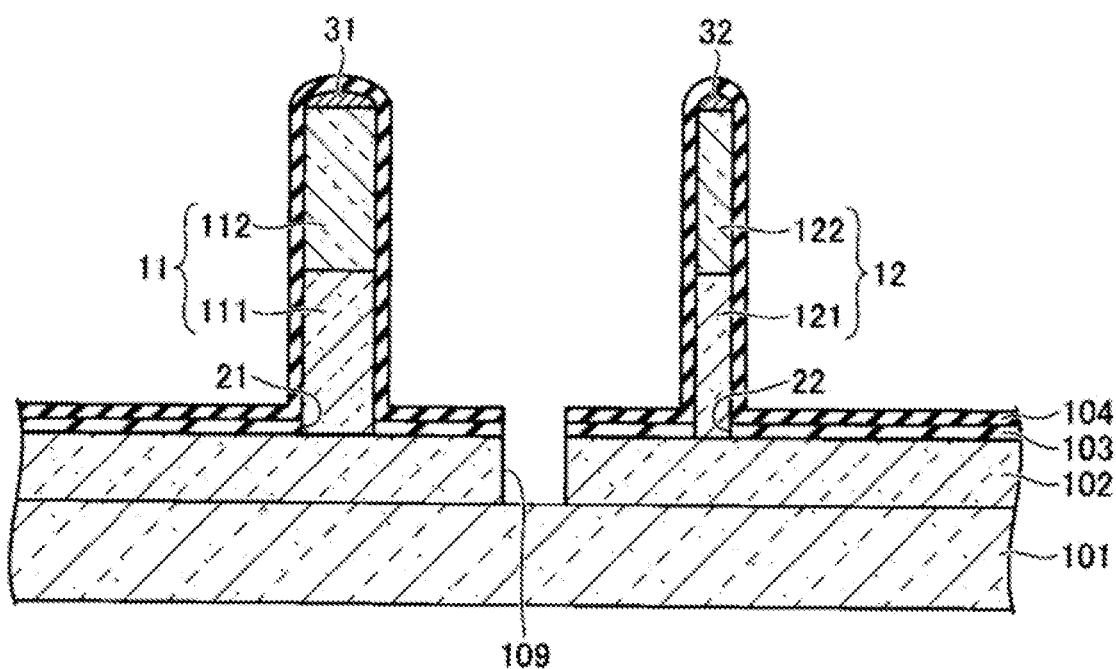
FIG. 8 is a cross-sectional view (part 5) illustrating the method for manufacturing the semiconductor device according to the first embodiment.

Thereafter, as illustrated in FIG. 8, the element separation groove 109 is formed in the insulating film 104, the insulating film 103, and the n-type semiconductor layer 102. The element separation groove 109 is formed to separate the n-type semiconductor layer 102 into the region connected to the first nanowire 11 and the region connected to the second nanowire 12. The element separation groove 109 may be formed by, for example, forming a mask by lithography and etching the insulating film 104, the insulating film 103, and the n-type semiconductor layer 102 by using the mask.

Figure 9:
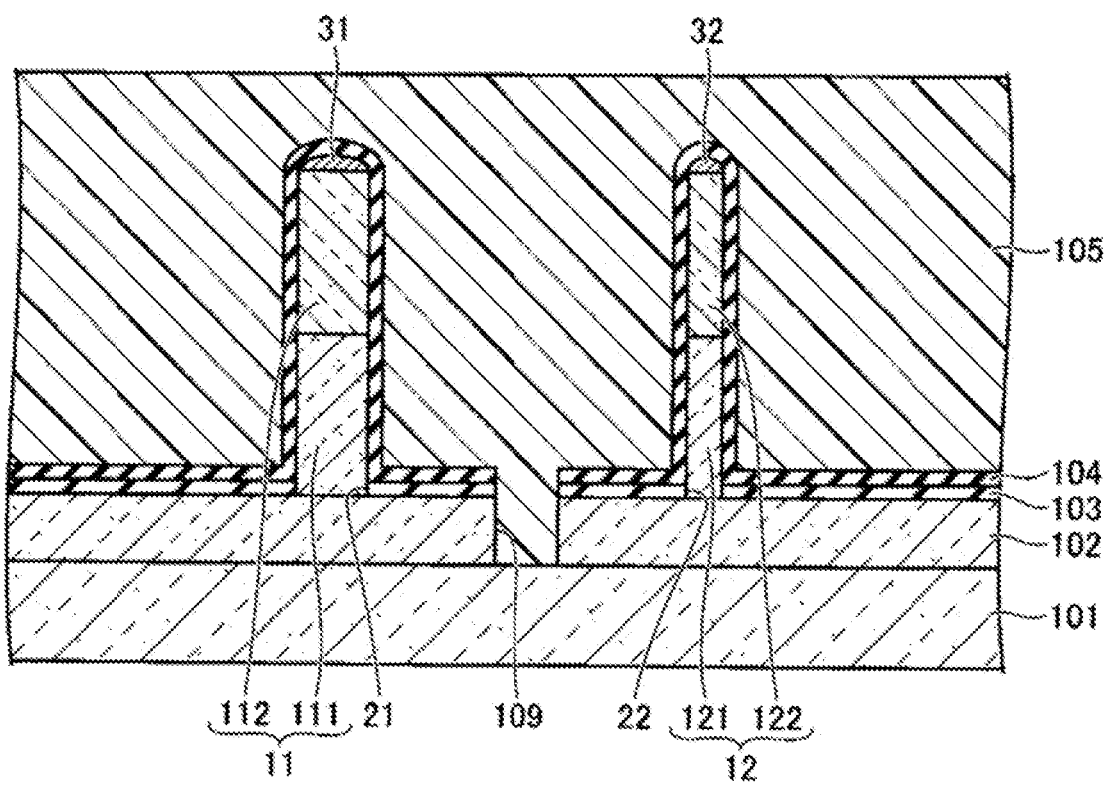
FIG. 9 is a cross-sectional view (part 6) illustrating the method for manufacturing the semiconductor device according to the first embodiment.

Subsequently, as illustrated in FIG. 9, the organic insulating film 105 is formed on the insulating film 104 while filling the element separation groove 109. The organic insulating film 105 is preferably formed with a thickness such that the entire upper surface thereof is positioned above top portions of the metal films 31 and 32. As the organic insulating film 105, for example, a BCB film is formed.

Figure 10:
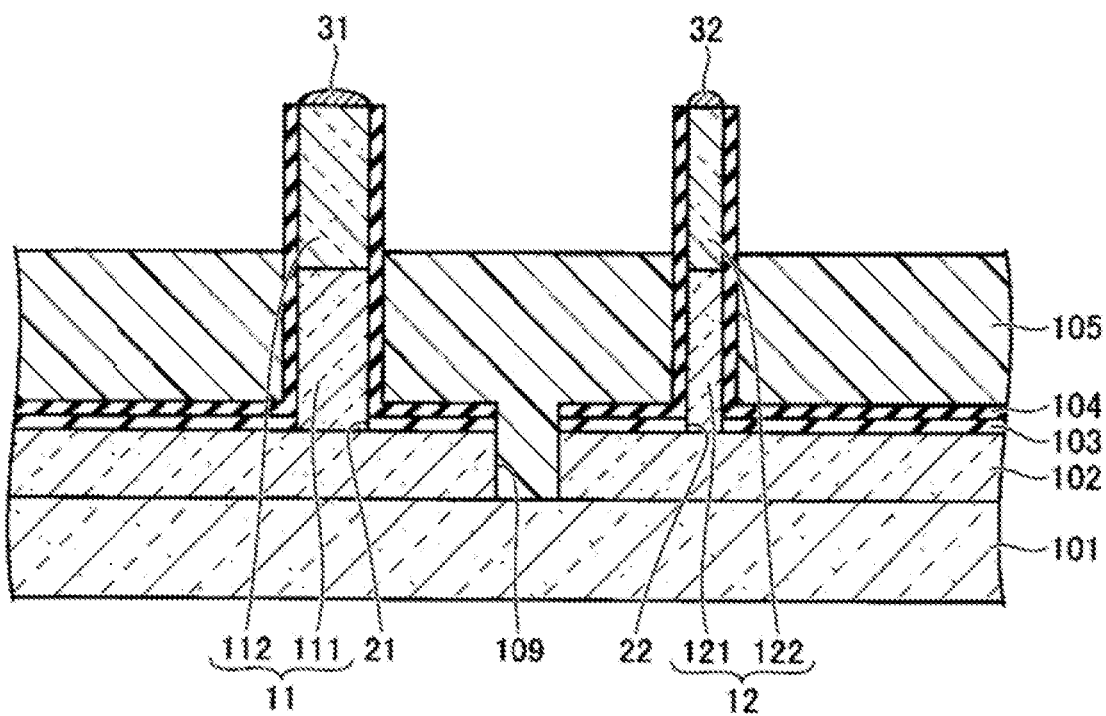
FIG. 10 is a cross-sectional view (part 7) illustrating the method for manufacturing the semiconductor device according to the first embodiment.

Next, as illustrated in FIG. 10, the organic insulating film 105 is dry-etched until the upper surface thereof is thick enough to be positioned about 300 nm below top portions of the first nanowire 11 and the second nanowire 12. For the dry etching, for example, a mixed gas of carbon tetrafluoride (CF$_4$) and oxygen (O$_2$) may be used. Portions of the insulating film 104 covering the metal films 31 and 32 are also removed by using a difference in an etching rate between the organic insulating film 105 and the insulating film 104. In a case where it is not possible to sufficiently remove the portions of the insulating film 104 covering the metal films 31 and 32 during the dry etching of the organic insulating film 105, the portions of the insulating film 104 covering the metal films 31 and 32 may be removed by, for example, ion sputtering using argon (Ar) ions after the dry etching of the organic insulating film 105.

Figure 11:
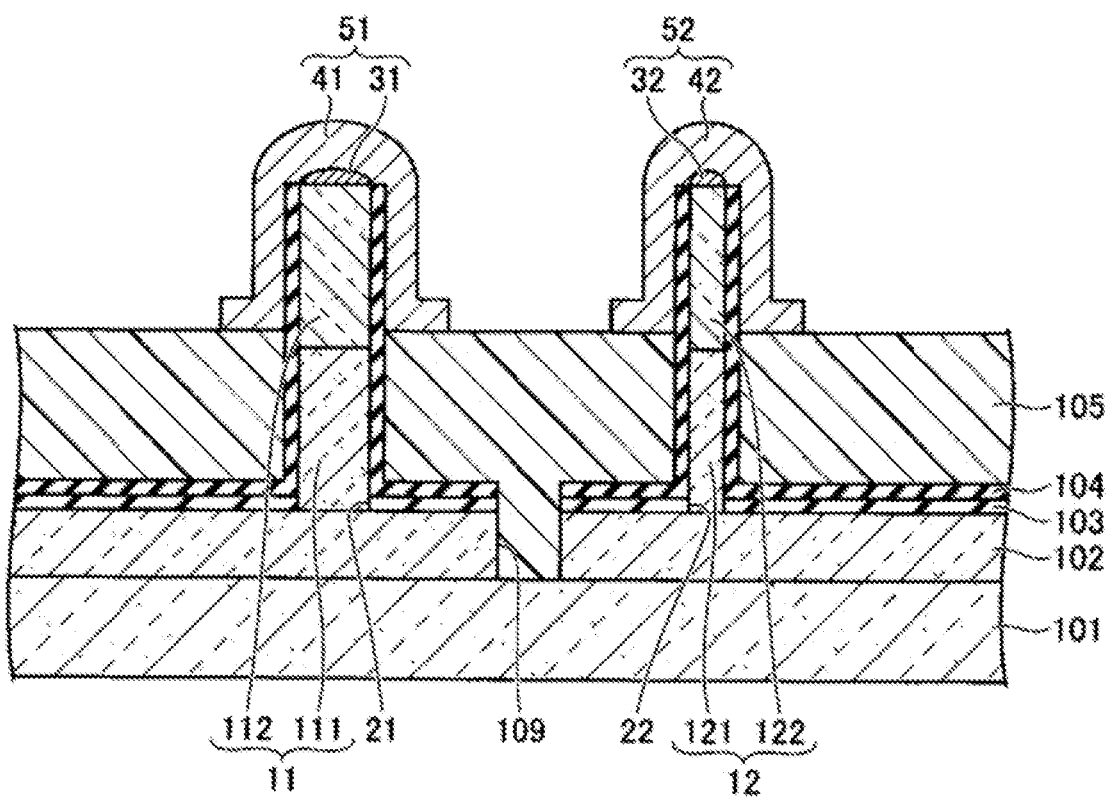
FIG. 11 is a cross-sectional view (part 8) illustrating the method for manufacturing the semiconductor device according to the first embodiment.

Thereafter, as illustrated in FIG. 11, on the organic insulating film 105, the metal film 41 in contact with the metal film 31 and the metal film 42 in contact with the metal film 32 are formed. As the metal films 31 and 32, for example, laminated films of a platinum (Pt) film and a gold (Au) film thereon are formed. The metal films 31 and 41 are included in the anode electrode 51, and the metal films 32 and 42 are included in the anode electrode 52.

Figure 12:
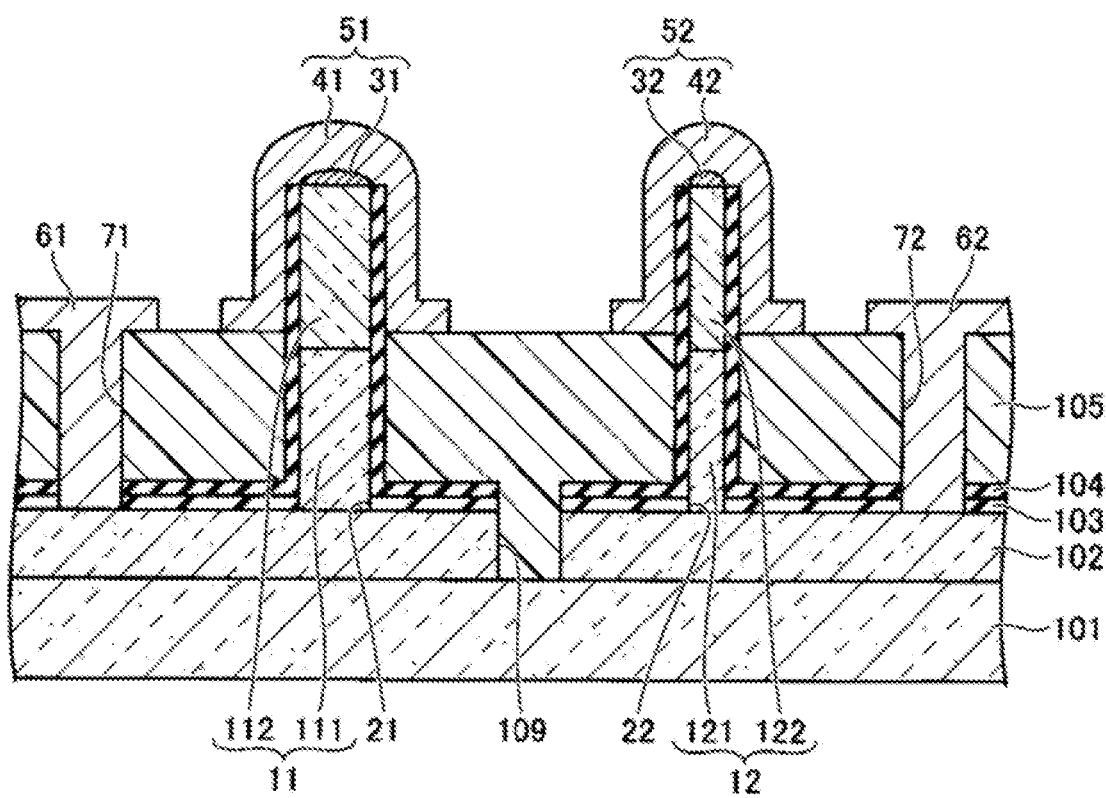
FIG. 12 is a cross-sectional view (part 9) illustrating the method for manufacturing the semiconductor device according to the first embodiment.

Subsequently, as illustrated in FIG. 12, in the organic insulating film 105, the insulating film 104, and the insulating film 103, the opening 71 reaching the region connected to the first semiconductor region 111 of the n-type semiconductor layer 102 and the opening 72 reaching the region connected to the first semiconductor region 121 of the n-type semiconductor layer 102 are formed. The openings 71 and 72 may be formed by, for example, forming a mask by lithography and etching the organic insulating film 105, the insulating film 104, and the insulating film 103 by using the mask. The insulating film 104 and the insulating film 103 may be removed by, for example, ion sputtering using argon (Ar) ions. After the openings 71 and 72 are formed, on the organic insulating film 105, the cathode electrode 61 in contact with the n-type semiconductor layer 102 through the opening 71 and the cathode electrode 62 in contact with the n-type semiconductor layer 102 through the opening 72 are formed. As the metal films 41 and 42, for example, laminated films of a gold germanium (AuGe) film and a gold (Au) film thereon are formed.

In this way, the semiconductor device 100 according to the first embodiment may be manufactured.

According to this method, it is possible to easily manufacture the semiconductor device 100 in which a plurality of nanowires (the first nanowire 11 and the second nanowire 12) having different voltage-current characteristics are arranged with a high degree of integration. Therefore, a plurality of nonlinear elements having different nonlinear characteristics may be arranged with a high degree of integration.

In the first embodiment, only the first nanowire 11 and the second nanowire 12 are provided above the substrate 101, but a larger number of nanowires may be provided.

The first semiconductor regions 111 and 121 need not have a nanowire shape, but the second semiconductor regions 112 and 122 having the nanowire shape are more easily formed when the first semiconductor regions 111 and 121 have the nanowire shape.

Figure 13:
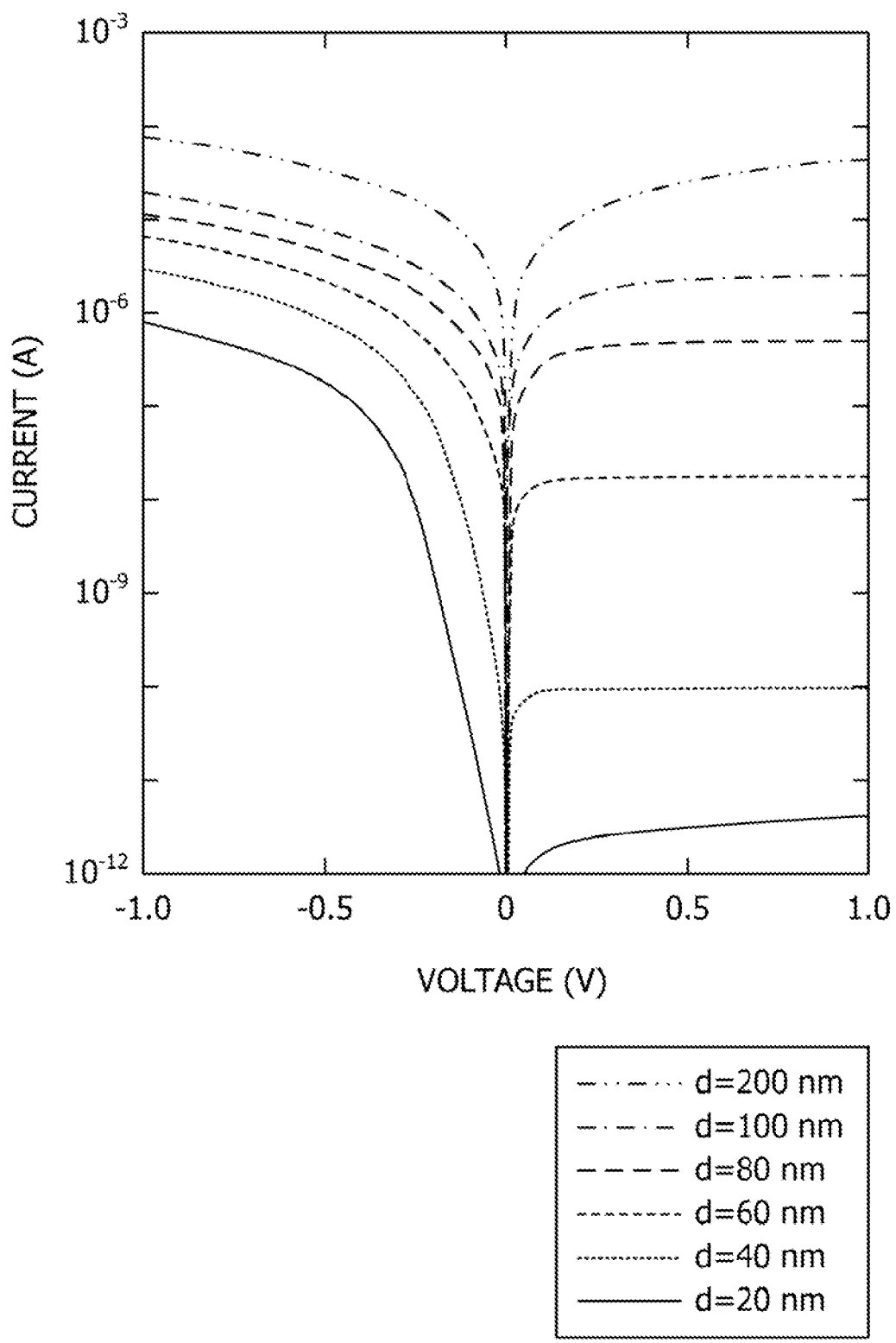
FIG. 13 is a diagram illustrating voltage-current characteristics of nanowires with various second semiconductor regions with different diameters.

As described above, the voltage-current characteristics of the first nanowire 11 and the second nanowire 12 change depending on the diameters of the second semiconductor regions 112 and 122. Here, a relationship between the diameter of the second semiconductor region and the voltage-current characteristics will be described. FIG. 13 is a diagram illustrating voltage-current characteristics of nanowires with various second semiconductor regions with different diameters. In FIG. 13, voltage-current characteristics of nanowires having a second semiconductor region doped with p-type impurities at a concentration of $5\times10^{17}$ cm$^{-3}$ and with a diameter d of 20 nm to 200 nm. By using the diameter region where a forward current transitions from the microampere order to the nanoampere order, a forward tunnel current may be greatly changed, and various nonlinear elements may be prepared collectively. From this point of view, in the example illustrated in FIG. 13, the diameter is preferably about 60 nm to 200 nm.

Figure 14:
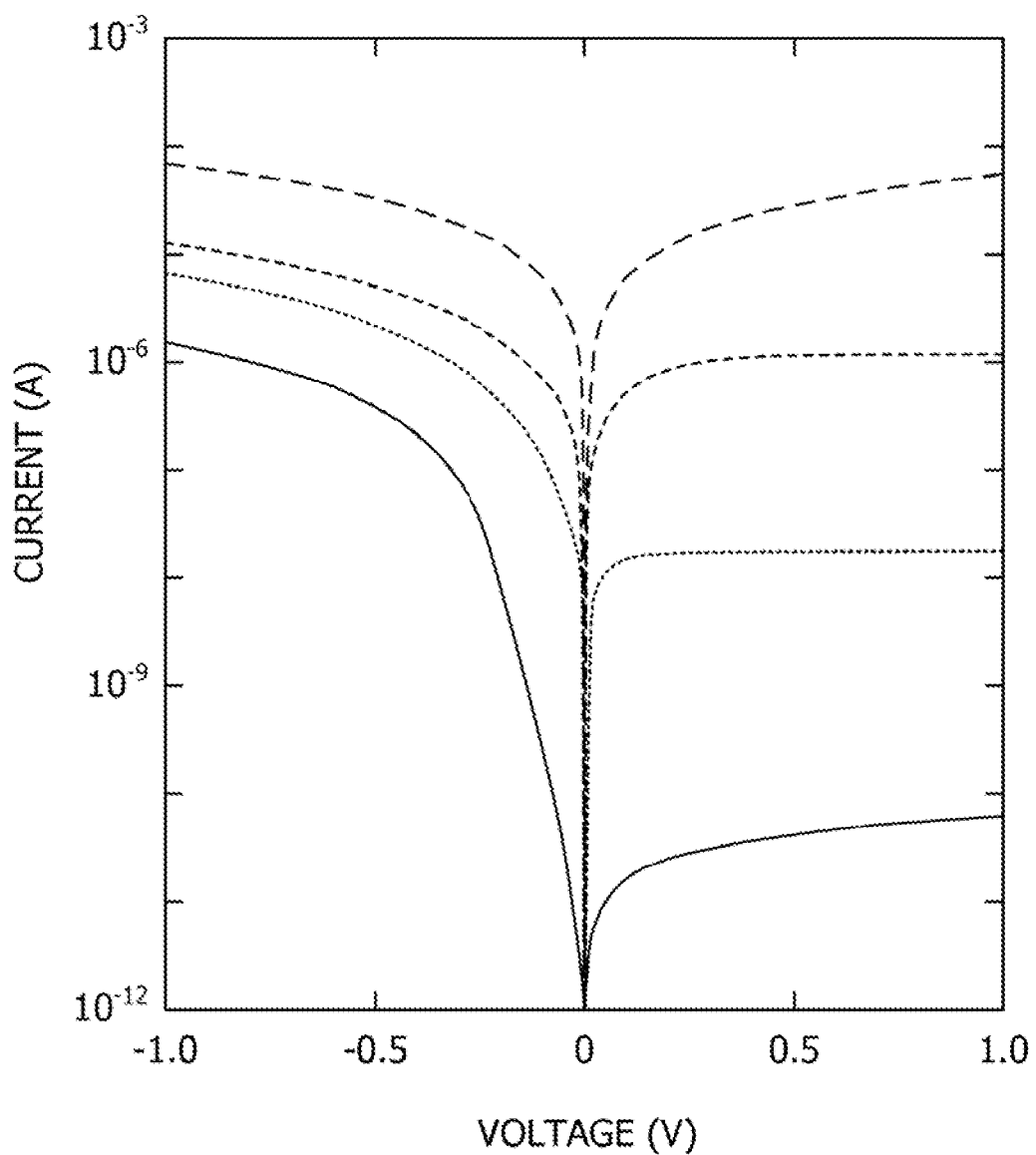
FIG. 14 is a diagram illustrating voltage-current characteristics of nanowires with various second semiconductor regions of different doping concentrations.

The voltage-current characteristics of the first nanowire 11 and the second nanowire 12 change depending not only on the diameters of the second semiconductor regions 112 and 122 but also on the doping concentrations of the p-type impurities (hereinafter may be referred to as doping concentrations) included in the second semiconductor regions 112 and 122. Here, a relationship between the doping concentration and the voltage-current characteristics will be described. FIG. 14 is a diagram illustrating voltage-current characteristics of nanowires with various second semiconductor regions of different doping concentrations. In FIG. 14, voltage-current characteristics of nanowires having a second semiconductor region with a diameter of 60 nm and a doping concentration ρ of $1\times10^{17}$ cm$^{-3}$ to $5\times10^{18}$ cm$^{-3}$ are illustrated. As described above, by using the diameter region where a forward current transitions from the microampere order to the nanoampere order, a forward tunnel current may be greatly changed, and various nonlinear elements may be prepared collectively. From this point of view, in the example illustrated in FIG. 14, the doping concentration is preferably about $5 \times 10^{17}$ cm$^{-3}$ to $5 \times 10^{18}$ cm$^{-3}$.

The inventors of the present application have made intensive studies to make the relationships illustrated in FIGS. 13 and 14 more general. As a result, it has been found that, in a case where the diameter d (cm) and the doping concentration p (cm$^{-3}$) of the second semiconductor region satisfy the following Expression (1), various nonlinear elements are efficiently obtained by using a plurality of nanowires having second semiconductor regions with different diameters.

$$1.8 \times 10^7 \leq d^2 \times p \leq 2 \times 10^8 \qquad \text{Expression (1)}$$

Note that, in a case where the diameter of the second semiconductor region changes in a height direction, for example, in a case where the diameter of the second semiconductor region is larger toward a side of the substrate, the diameter d in Expression (1) is the diameter on the upper surface of the second semiconductor region.

Second Embodiment

Figure 15:
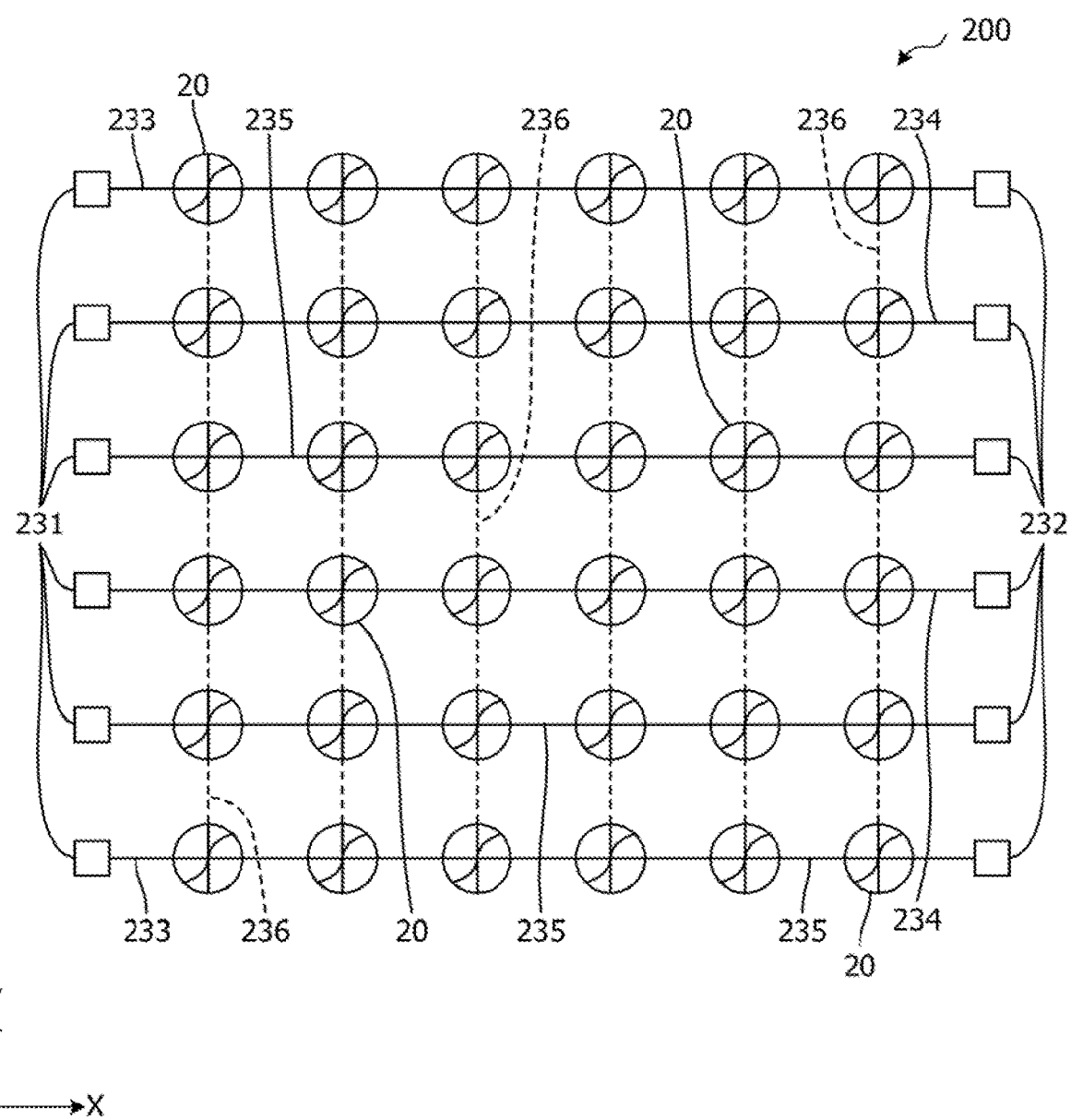
FIG. 15 is a circuit diagram illustrating a reservoir circuit according to a second embodiment.
Figure 16:
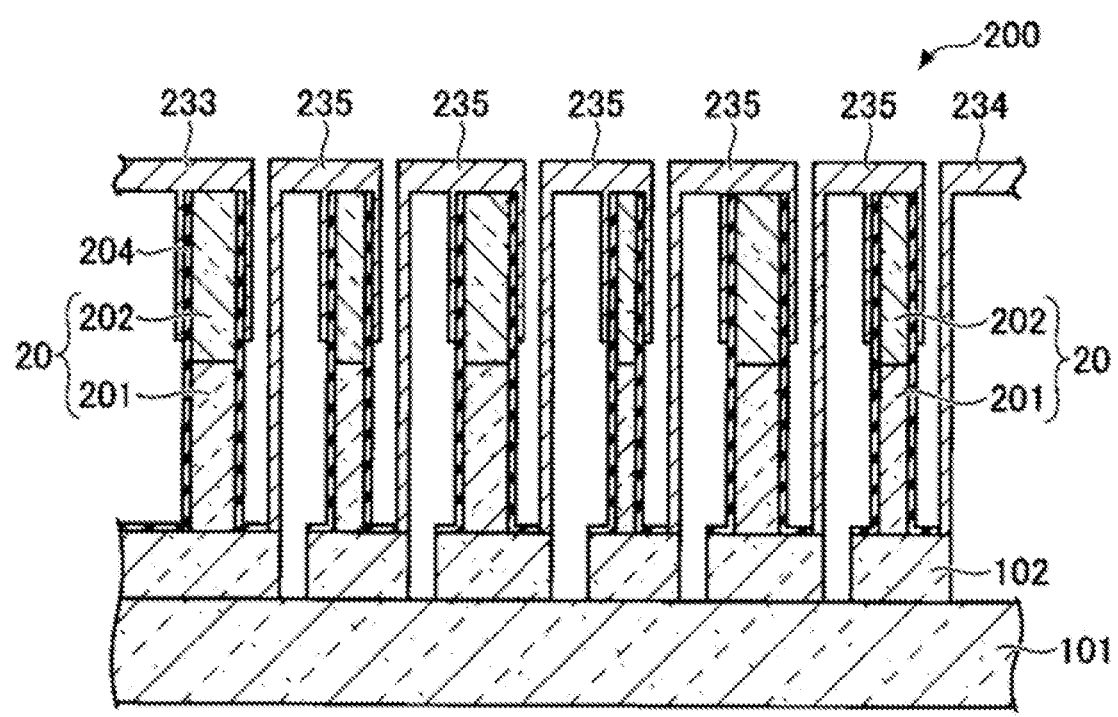
FIG. 16 is a cross-sectional view illustrating the reservoir circuit according to the second embodiment.

A second embodiment will be described. The second embodiment relates to a reservoir circuit including a plurality of nanowires having different nonlinear characteristics. The reservoir circuit is an example of a semiconductor device. FIGS. 15 and 16 are diagrams illustrating the reservoir circuit according to the second embodiment. FIG. 15 is a circuit diagram illustrating a connection relationship of a plurality of nanowires, and FIG. 16 is a cross-sectional view illustrating the connection relationship of the plurality of nanowires. In FIG. 16, a part of configurations such as an insulating film are omitted.

As illustrated in FIG. 16, a reservoir circuit 200 according to the second embodiment includes a substrate 101, an n-type semiconductor layer 102, a plurality of nanowires 20, a wire 233, a wire 234, a wire 235, a wire 236, an input terminal 231, and an output terminal 232.

The nanowire 20 has an n-type first semiconductor region 201 and a p-type second semiconductor region 202. The first semiconductor region 201 is provided on the n-type semiconductor layer 102 and extends upward. The second semiconductor region 202 is provided on the first semiconductor region 201 and extends upward. Diameters are different among the plurality of nanowires 20. Not all the nanowires 20 need to be different in diameter and nanowires 20 with equal diameter may be included. The n-type semiconductor layer 102 is element-separated for each nanowire 20.

As illustrated in FIG. 15, for example, the plurality of nanowires 20 is arranged at equal intervals in two directions (X direction and Y direction) orthogonal to each other. In other words, the plurality of nanowires 20 is arranged in a grid pattern in a plan view above the substrate 101. For example, the input terminal 231 and the output terminal 232 are provided in the same number as the number of rows including the plurality of nanowires 20 arranged in the X direction. The wire 233 connects the input terminal 231 and the second semiconductor region 202 of the nanowire 20 positioned at one end of the plurality of nanowires 20 arranged in the X direction. The wire 234 connects the output terminal 232 and the n-type semiconductor layer 102 connected to the first semiconductor region 201 of the nanowire 20 positioned at the other end of the plurality of nanowires 20 arranged in the X direction. The wire 235 connects the n-type semiconductor layer 102 connected to one first semiconductor region 201 and the other second semiconductor region 202 between two nanowires 20 adjacent to each other in the X direction. The wire 236 connects one second semiconductor region 202 and the other second semiconductor region 202 between two nanowires 20 adjacent to each other in the Y direction.

A part of the wire 233 and a part of the wire 236 function as anode electrodes, and a part of the wire 234 functions as a cathode electrode. A part of the wire 235 functions as an anode electrode, and another part thereof functions as a cathode electrode. Similarly to the metal films 41 and 42 in the first embodiment, the portions of the wires 233, 235, and 236 that function as anode electrodes are configured to include surfaces that face side surfaces of the second semiconductor regions 202 with an insulating film 204 interposed therebetween.

According to the second embodiment, the plurality of nanowires 20 having different nonlinear characteristics is connected in a network shape. Therefore, the reservoir circuit 200 including a plurality of nonlinear elements having various nonlinear characteristics with a high degree of integration is obtained. Furthermore, since the nonlinear characteristics are different among the plurality of nanowires 20 when the diameters are different even when materials and compositions are the same, manufacturing may be performed without needing complicated processing.

Although 36 (6×6) nanowires 20 are illustrated in FIG. 15, it is preferable that a larger number of nanowires 20 are provided.

Modification of Second Embodiment

Figure 17:
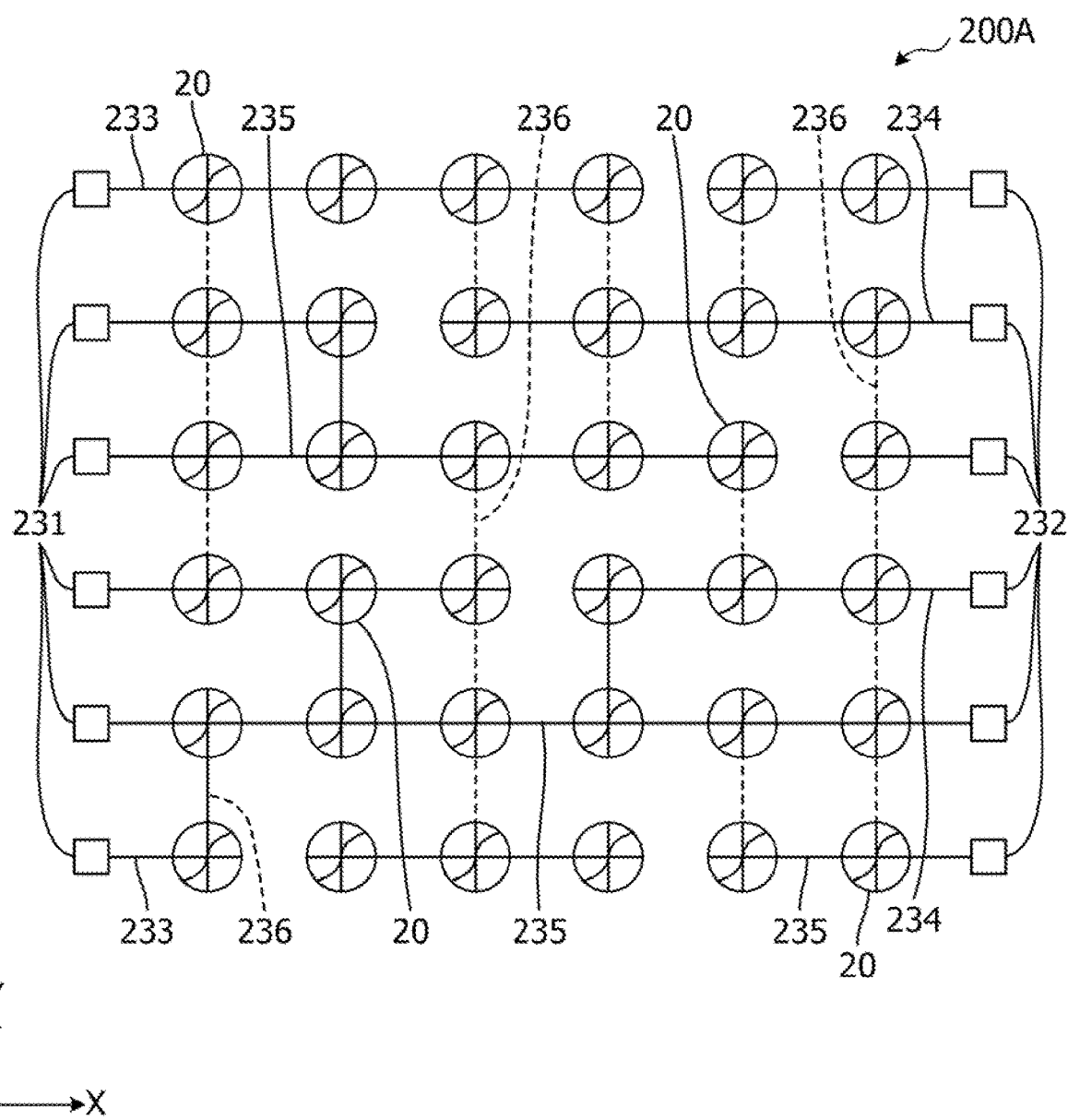
FIG. 17 is a circuit diagram illustrating a reservoir circuit according to a modification of the second embodiment.

A modification of the second embodiment will be described. The modification is different from the second embodiment in the connection relationship of the plurality of nanowires 20. FIG. 17 is a diagram illustrating a reservoir circuit according to the modification of the second embodiment. FIG. 17 is a circuit diagram illustrating the connection relationship of the plurality of nanowires.

As illustrated in FIG. 17, in a reservoir circuit 200A according to the modification, the wire 235 is not provided in a part of pairs of nanowires 20 adjacent to each other in the X direction. Furthermore, the wire 236 is not provided in a part of pairs of nanowires 20 adjacent to each other in the Y direction.

Other configurations are similar to those in the second embodiment.

According to the reservoir circuit 200A according to the modification, irregularity of the network of the nonlinear elements may be made higher than that of the reservoir circuit 200 according to the second embodiment.

In the second embodiment or the modification thereof, a plurality of the second semiconductor regions is connected or the first semiconductor region and the second semiconductor region are connected through the wire, but a plurality of the first semiconductor regions may be connected through the wire.

Third Embodiment

Figure 18:
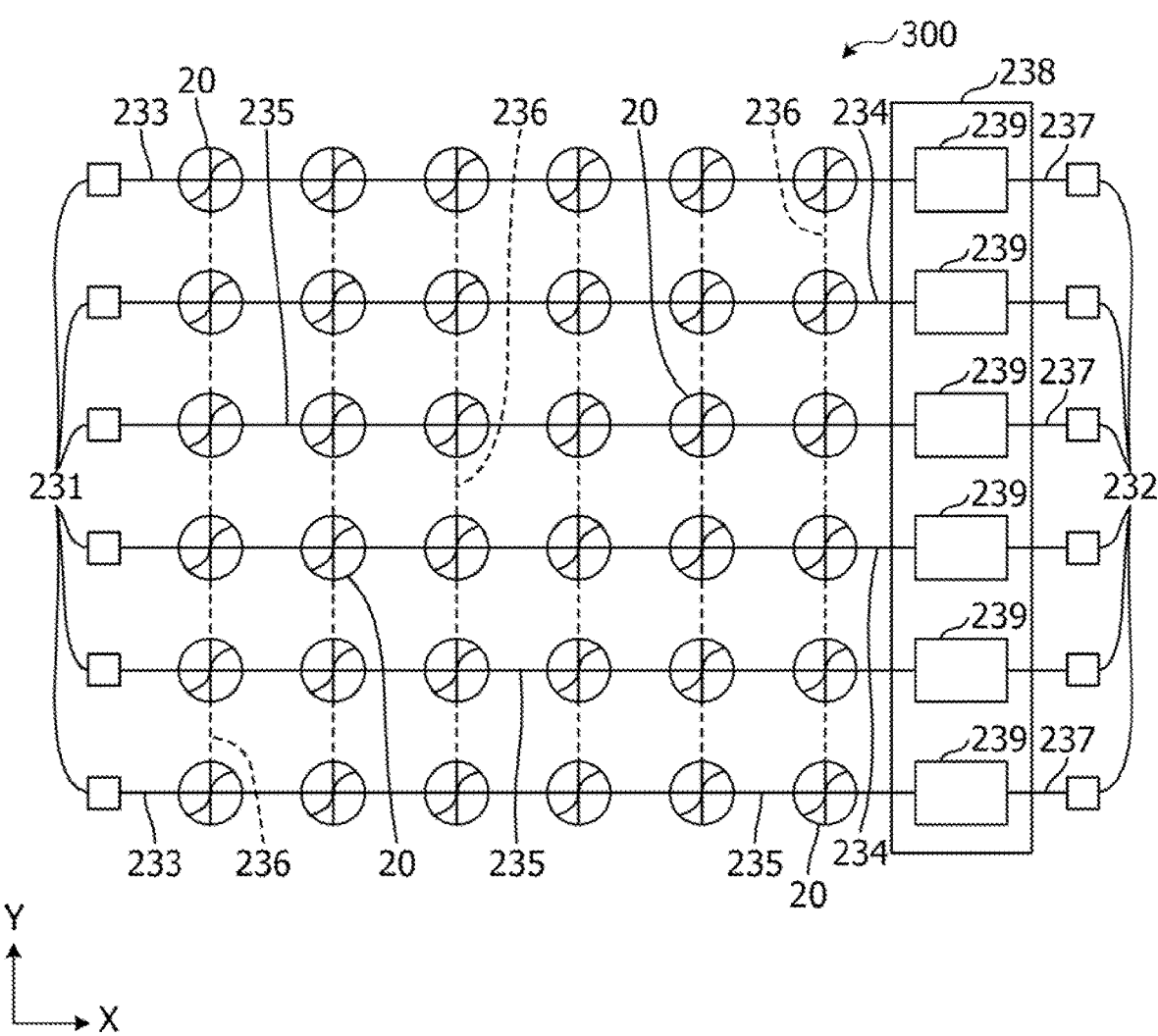
FIG. 18 is a circuit diagram illustrating a reservoir circuit according to a third embodiment.
Figure 19:
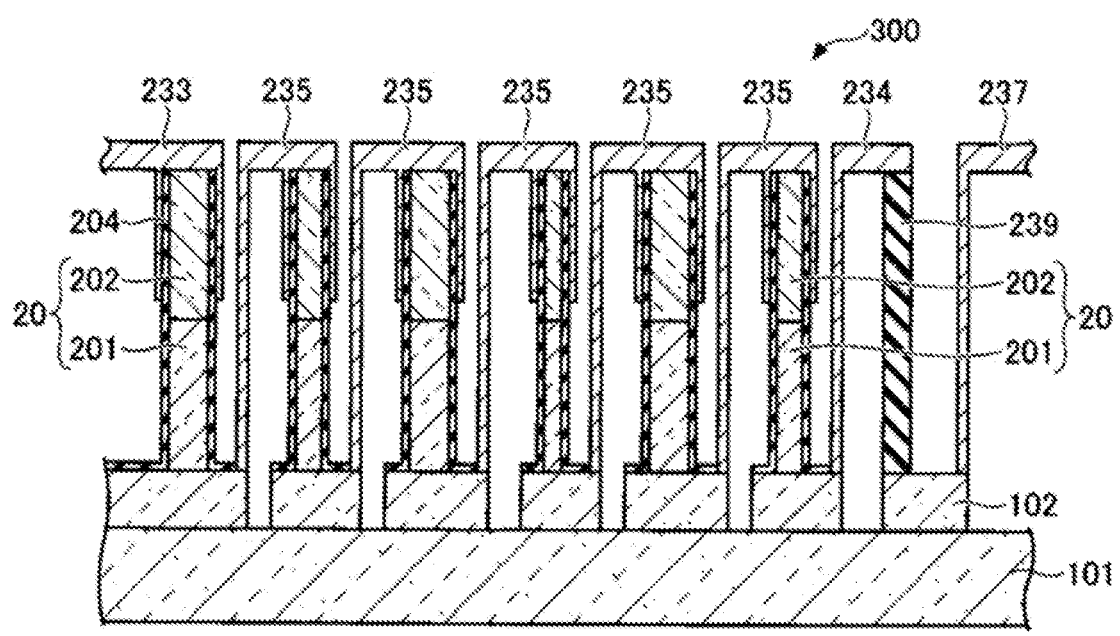
FIG. 19 is a cross-sectional view illustrating the reservoir circuit according to the third embodiment.

A third embodiment will be described. The third embodiment relates to a reservoir circuit including a plurality of nanowires having different nonlinear characteristics and including a variable weighting circuit. The reservoir circuit is an example of a semiconductor device. FIGS. 18 and 19 are diagrams illustrating the reservoir circuit according to the third embodiment. FIG. 18 is a circuit diagram illustrating a connection relationship of a plurality of nanowires, and FIG. 19 is a cross-sectional view illustrating the connection relationship of the plurality of nanowires. In FIG. 19, a part of configurations such as an insulating film are omitted.

As illustrated in FIG. 19, a reservoir circuit 300 according to the third embodiment includes a substrate 101, an n-type semiconductor layer 102, a plurality of nanowires 20, a wire 233, a wire 234, a wire 235, a wire 236, a wire 237, a variable weighting circuit 238, an input terminal 231, and an output terminal 232. The substrate 101, the n-type semiconductor layer 102, the plurality of nanowires 20, the wire 233, the wire 235, and the wire 236 are configured similarly to those in the second embodiment.

The variable weighting circuit 238 includes an oxide memristor 239 provided for each row including the plurality of nanowires 20 arranged in an X direction. The wire 234 connects one end of the oxide memristor 239 and the n-type semiconductor layer 102 connected to a first semiconductor region 201 of the nanowire 20 positioned at the other end of the plurality of nanowires 20 arranged in the X direction. The wire 237 connects the output terminal 232 and the n-type semiconductor layer 102 to which the other end of the oxide memristor 239 is connected. The oxide memristor 239 is an example of an analog memory.

Other configurations are similar to those in the second embodiment.

In the reservoir circuit 300 according to the third embodiment, a resistance of the oxide memristor 239 changes according to a current (signal intensity) output from the plurality of nanowires 20 through the wire 234, and weight information is held in the variable weighting circuit 238. The reservoir circuit 300 according to the third embodiment corresponds to a device which integrates up to linear reading in a reservoir computing system.

Fourth Embodiment

Figure 20:
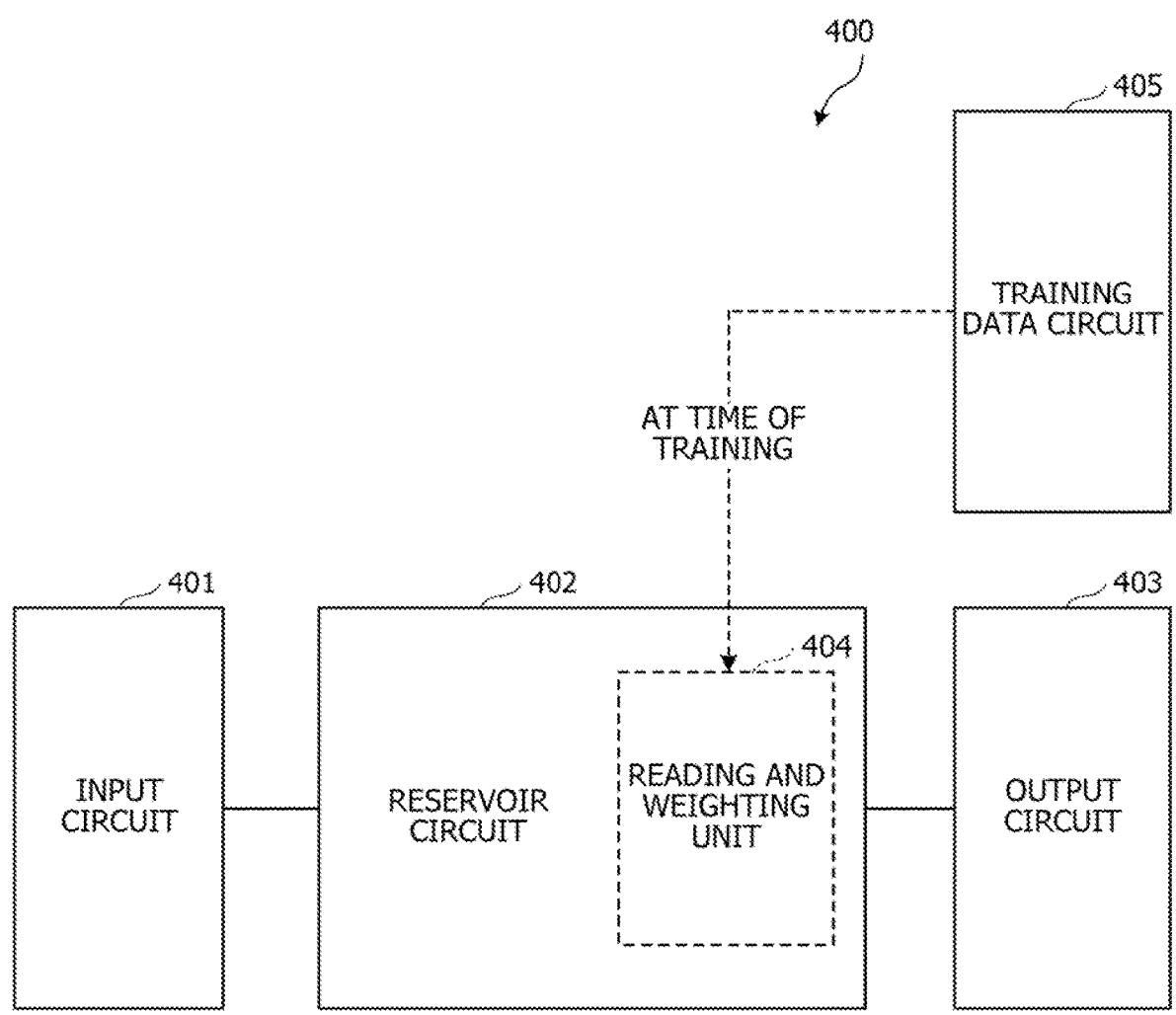
FIG. 20 is a block diagram illustrating a reservoir computing system according to a fourth embodiment.

A fourth embodiment will be described. A fourth embodiment relates to a reservoir computing system including a reservoir circuit. FIG. 20 is a block diagram illustrating the reservoir computing system according to the fourth embodiment.

As illustrated in FIG. 20, a reservoir computing system 400 according to the fourth embodiment includes an input circuit 401, a reservoir circuit 402, and an output circuit 403. The reservoir circuit 402 includes a reading and weighting unit 404. The reservoir computing system 400 may further include a training data circuit 405. As the reservoir circuit 402, the reservoir circuit 200 or 300 may be used.

At the time of training of the reservoir computing system 400, training data (teacher data) is input from the training data circuit 405 to the reading and weighting unit 404, and the reading and weighting unit 404 is adjusted so that appropriate weighting is performed. The reading and weighting unit 404 is an example of an analog memory.

When the reservoir computing system 400 is used, the training data circuit 405 is separated from the reservoir circuit 402. Then, data is input from the input circuit 401 to the reservoir circuit 402, and in the reservoir circuit 402, arithmetic processing such as weighting by the reading and weighting unit 404 is performed on the input data. A result of the arithmetic processing in the reservoir circuit 402 is output from the output circuit 403.

According to the fourth embodiment, nanowires, which are a plurality of nonlinear elements included in the reservoir computing system 400, may be arranged with a high degree of integration.

Although the preferred embodiments and the like have been described in detail above, the present disclosure is not limited to the embodiments and the like described above, and various modifications and substitutions may be made to the embodiments and the like described above without departing from the scope described in claims.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
a plurality of tunnel diodes, each of which includes a first semiconductor region of a first conductive type and a second semiconductor region of a second conductive type that is provided above the first semiconductor region, the second semiconductor region being a nanowire shape;
an insulating film provided around a side surface of the second semiconductor region;
a plurality of first electrodes, each coupled to the first semiconductor region; and
a plurality of second electrodes, each coupled to the second semiconductor region,
wherein the second electrode has a first surface that faces the side surface of the second semiconductor region across the insulating film, and
a diameter on an upper surface of a second semiconductor region of a first tunnel diode of the plurality of tunnel diodes is different from a diameter on an upper surface of a second semiconductor region of a second tunnel diode of the plurality of tunnel diodes.

2. The semiconductor device according to claim 1, wherein a relationship of Expression (1) holds when it is assumed that a diameter on an upper surface of the second semiconductor region is d (cm) and a concentration of an impurity of a second conductive type included in the second semiconductor region is $\rho$ (cm$^{-3}$):

$$1.8 \times 10^7 \leq d^2 \times \rho 2 \times 10^8 \qquad \text{Expression (1)}.$$

3. The semiconductor device according to claim 1, wherein the insulating film has a thickness of 10 nm or more and 30 nm or less.

4. The semiconductor device according to claim 1, wherein a first part of the plurality of first electrodes is coupled to a second part of the plurality of first electrodes or one of the plurality of second electrodes.

5. The semiconductor device according to claim 1, wherein a first part of the plurality of second electrodes is coupled to a second part of the plurality of second electrodes or one of the plurality of first electrodes.

6. The semiconductor device according to claim 1, wherein a lower surface of the second electrode is above an interface between the first semiconductor region and the second semiconductor region.

7. The semiconductor device according to claim 1, wherein the first semiconductor region has a nanowire shape.

8. The semiconductor device according to claim 1, wherein concentrations of impurities of a second conductive type included in the second semiconductor region are equal among the plurality of tunnel diodes.

9. A reservoir computing system comprising:
an input circuit;
an output circuit; and
a reservoir circuit connected between the input circuit and the output circuit,
wherein the reservoir circuit includes the semiconductor device includes:
a plurality of tunnel diodes, each of which includes a first semiconductor region of a first conductive type and a second semiconductor region of a second conductive type that is provided above the first semiconductor region, the second semiconductor region being a nanowire shape;
an insulating film provided around a side surface of the second semiconductor region;
a plurality of first electrodes, each coupled to the first semiconductor region; and
a plurality of second electrodes, each coupled to the second semiconductor region,
wherein the second electrode has a first surface that faces the side surface of the second semiconductor region across the insulating film, and
a diameter on an upper surface of a second semiconductor region of a first tunnel diode of the plurality of tunnel diodes is different from a diameter on an upper surface of a second semiconductor region of a second tunnel diode of the plurality of tunnel diodes.

10. The reservoir computing system according to claim 9, wherein
the reservoir circuit includes an analog memory, and the reservoir computing system further comprising
a training data circuit that inputs teacher data to the analog memory.

11. A method for manufacturing a semiconductor device, comprising processing of:
forming a plurality of tunnel diodes, each of which includes a first semiconductor region of a first conductive type and a second semiconductor region of a second conductive type that is provided above the first semiconductor region and has a nanowire shape;
forming an insulating film around a side surface of the second semiconductor region;
forming a plurality of first electrodes, each coupled to the first semiconductor region; and
forming a plurality of second electrodes, each coupled to the second semiconductor region,
wherein the processing of forming the plurality of tunnel diodes includes processing of:
forming a growth mask that has a plurality of openings with different diameters above a substrate;
growing a plurality of the first semiconductor regions through the plurality of openings; and
growing the second semiconductor region on each of the first semiconductor regions,
the second electrode has a first surface that faces the side surface of the second semiconductor region across the insulating film, and
a diameter on an upper surface of a second semiconductor region of a first tunnel diode of the plurality of tunnel diodes is different from a diameter on an upper surface of a second semiconductor region of a second tunnel diode of the plurality of tunnel diodes.

* * * * *